United States Patent
Yoshikawa et al.

(10) Patent No.: US 7,625,677 B2
(45) Date of Patent: Dec. 1, 2009

(54) HALF-TONE STACKED FILM, PHOTOMASK-BLANK, PHOTOMASK AND FABRICATION METHOD THEREOF

(75) Inventors: Hiroki Yoshikawa, Joetsu (JP); Yukio Inazuki, Joetsu (JP); Yoshinori Kinase, Joetsu (JP); Satoshi Okazaki, Joetsu (JP); Motohiko Morita, Tokyo (JP); Tadashi Saga, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 575 days.

(21) Appl. No.: 11/346,224

(22) Filed: Feb. 3, 2006

(65) Prior Publication Data

US 2006/0177746 A1 Aug. 10, 2006

(30) Foreign Application Priority Data

Feb. 4, 2005 (JP) .............................. 2005-028410

(51) Int. Cl.
*G03F 1/00* (2006.01)
(52) U.S. Cl. ............................ 430/5; 430/311; 430/394
(58) Field of Classification Search .................... 430/5, 430/311
See application file for complete search history.

(56) References Cited

U.S. PATENT DOCUMENTS

| 2002/0028392 | A1  | 3/2002  | Jin et al.   |        |
|--------------|-----|---------|--------------|--------|
| 2003/0180631 | A1* | 9/2003  | Shiota et al. | 430/5  |
| 2003/0219654 | A1* | 11/2003 | Ushida et al. | 430/5  |

FOREIGN PATENT DOCUMENTS

| EP | 1 783 546 A1  |   | 5/2007 |
|----|---------------|---|--------|
| JP | 2003050454 A  | * | 2/2003 |
| JP | 2004-029746   |   | 1/2004 |

OTHER PUBLICATIONS

English Translation of JP 2003050454 A Feb. 2003.*

* cited by examiner

*Primary Examiner*—Mark F Huff
*Assistant Examiner*—Rashid Alam
(74) *Attorney, Agent, or Firm*—Finnegan, Henderson, Farabow, Garrett & Dunner LLP

(57) ABSTRACT

A half-tone stacked film is designed so as to have a stacked structure of a first half-tone film and a second half-tone film, and the film thickness d, the refractive index n to exposure light and the extinction coefficient k of these half-tone films are designed so that one of these half-tone films becomes a phase advancement film and the other becomes a phase retardation film. When the film thickness (nm), the refractive index, and the extinction coefficient of the phase advancement film are represented by $d^{(+)}$, $n^{(+)}$ and $k^{(+)}$, respectively; and the film thickness (nm), the refractive index, and the extinction coefficient of the phase retardation film are $d^{(-)}$, $n^{(-)}$, and $k^{(-)}$, respectively; the phase advancement film has the relationship of $k^{(+)} > a_1 \cdot n^{(+)} + b_1$, and the phase retardation film has the relationship of $k^{(-)} < a_2 \cdot n^{(-)} + b_2$.

26 Claims, 6 Drawing Sheets

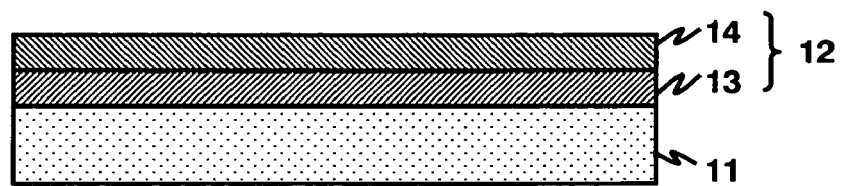
FIG.1A
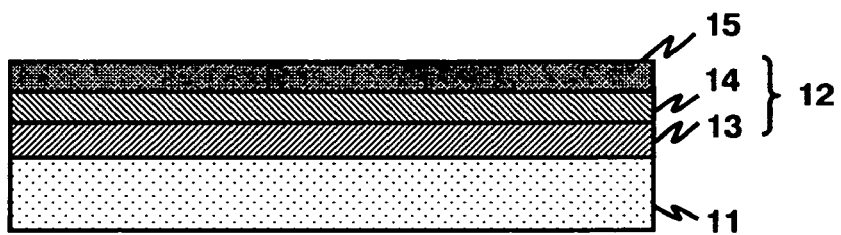
FIG.1B
FIG.2
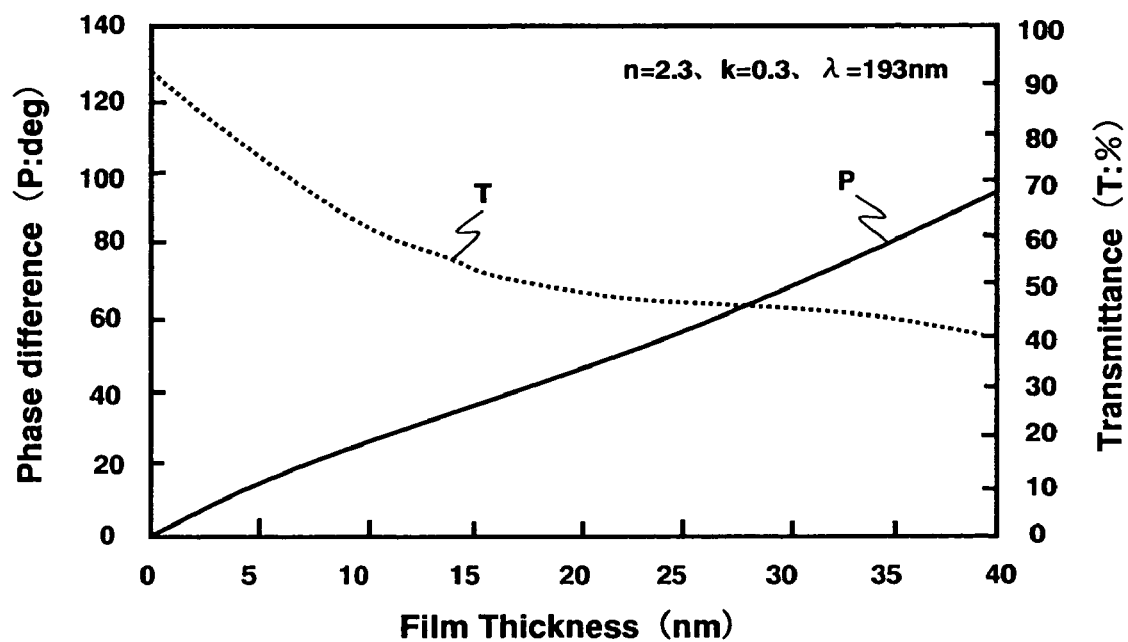

a: d=30nm (k = 4.1847n − 3.589)
b: d=20nm (k = 3.0856n − 2.64)
c: d=16nm (k = 2.5157n − 2.0737)
d: d=10nm (k = 1.8308n − 1.3833)
e: d= 5nm (k = 1.4142n − 0.9432)

a = 0.113d + 0.774 b = −0.116d − 0.281

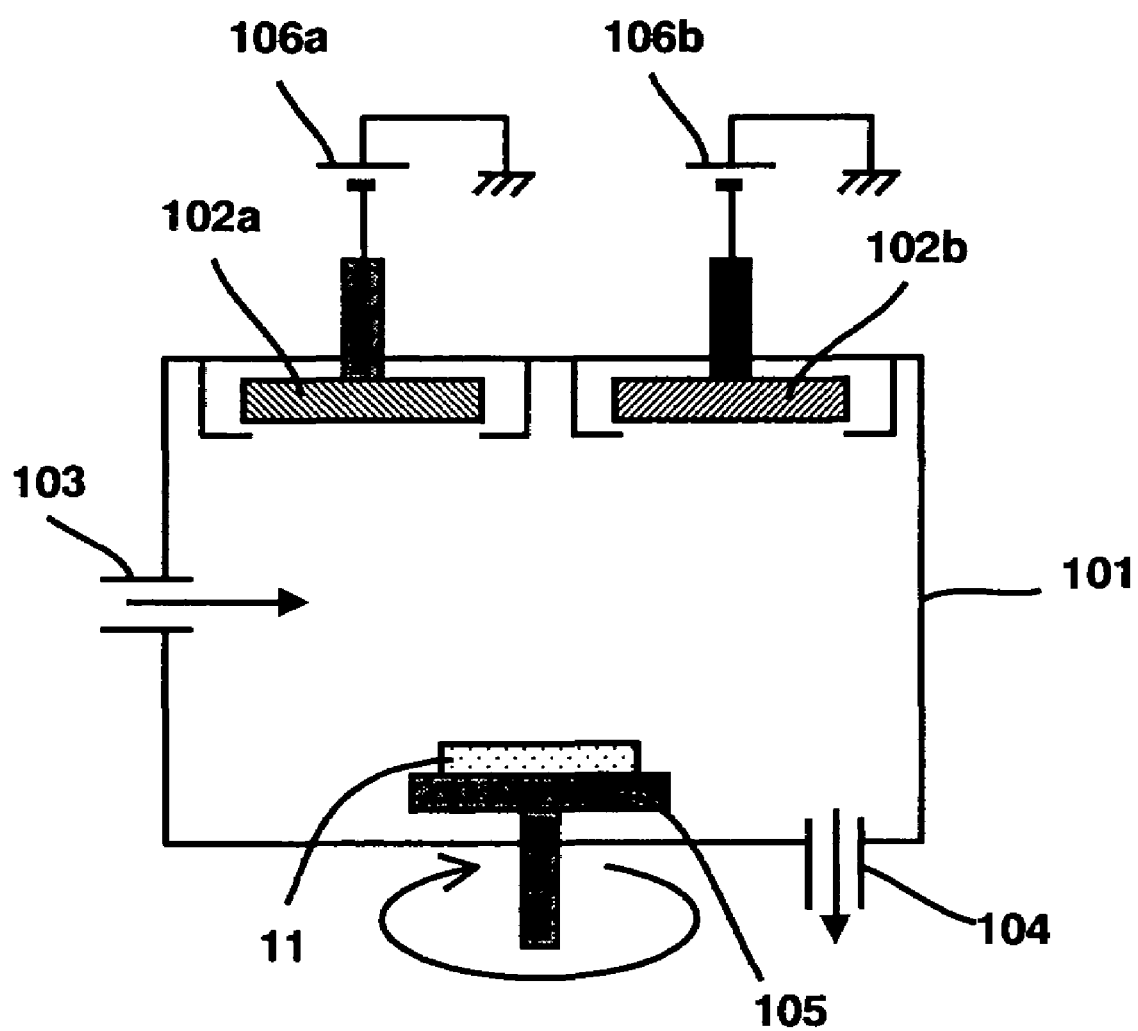

HALF-TONE STACKED FILM, PHOTOMASK-BLANK, PHOTOMASK AND FABRICATION METHOD THEREOF

BACKGROUND OF THE INVENTION

1. Field of the Invention

The present invention relates to a photomask technique used in microfabrication of semiconductor integrated circuits, CCDs (charge-coupled devices), color filters for LCD (liquid crystal displays), and magnetic heads.

2. Description of the Related Art

In recent years, an advanced semiconductor microfabrication technique has been an extremely important element technique to respond the requirement of finer circuit patterns accompanying high integration of large scale integrated circuits. For example, the high integration of large scale integrated circuits requires a technique for the miniaturization of wires for wiring patterns constituting circuits, or technique for forming finer contact-hole patterns for wirings between layers constituting a cell as an essential technique. The reason why the formation of finer patterns of large scale integrated circuits is accelerated is due to the high-speed operation and low power consumption thereof, and the most effective method therefor is the miniaturization of patterns.

Since most of such high degree of microfabrication is performed by photolithography technique using a photomask, the photomask has become basic techniques that support the miniaturization technique together with exposure systems and resist materials. Therefore, for the purpose of realizing a photomask having the above-described wiring patterns with finer wires or miniaturized contact-hole patterns, the development of techniques for forming finer and more accurate patterns on a photomask blank have been carried out.

The formation of a high-accuracy photomask pattern on a photomask substrate is premised on highly accurate patterning of a resist pattern formed on a photomask blank. Since photolithography in the microfabrication of a semiconductor substrate is carried out using a reduced projection method, the size of the pattern formed on the photomask is about four times the size of the pattern formed on the semiconductor substrate; however, this does not mean that the accuracy of the pattern formed on the photomask is relaxed, but the formation of the photomask pattern at higher accuracy than the pattern accuracy obtained on the semiconductor substrate after exposure is required.

At present, since the size of the circuit pattern drawn on the semiconductor substrate in photolithography is considerably smaller than the wavelength of exposure light, if a photomask on which a photomask pattern is formed by expanding the circuit pattern by four times is used as it is for reduction exposure, the shape same as the photomask pattern cannot be transferred on the resist film because of the effect of the interference of exposure light or the like.

Therefore, as a super resolution mask, an OPC mask to which a technique for correcting optical proximity effect that deteriorates transferring properties by performing a technique known as optical proximity effect correction (OPC) is applied, or a phase shift mask of which an amplitude of light at the middle of adjoining opening patterns is made zero by changing the phase of adjoining opening patterns by 180° is typically used. For example, for the OPC mask, an OPC pattern of a size ½ or less of the circuit pattern (hammer head, assist bar or the like) must be formed.

As described above, not only in photolithography for obtaining a circuit pattern on a semiconductor substrate, but also in photolithography for forming a pattern on a photomask blank, a high-accuracy patterning technique is required. One of indicators of photolithography performance is "critical resolution", and for photolithography in the photomask patterning step, a high critical resolution equivalent to or higher than the critical resolution for photolithography in the step of circuit patterning on the semiconductor substrate is required.

Phase shift masks are roughly classified into a complete transmission (Levenson type) phase shift mask and a half-tone-type phase shift mask according to the light transmission properties of the phase shifter formed on a transparent substrate for exposure light. The light transmittance of the phase shifter formed in the complete transmission phase shift mask is substantially equal to the light transmittance of the substrate (exposed portion), and is virtually transparent to the exposure light.

In this type of photomask, since the interference effect between transmitted light of which phase is reversed by 180° from the region equipped with a phase shifter and transmitted light without phase change from the region not equipped with a phase shifter is large, excellent resolution can be obtained. However, there are problems that formable mask patterns are limited to continuous patterns, the fabrication costs of the photomask are very high, and the like.

In a half-tone phase shift mask, an absorber material having a transmittance of exposure light of some several to several tens of percent of the substrate (exposed portion) is used in the phase shifter, and although resolution as in a complete transmission phase shift mask cannot be obtained from this type of photomask, there are advantages of little restriction to the mask pattern and low fabrication costs of the photomask.

In Japanese Patent Application Laid-Open No. 2004-029746, the configuration of a photomask using the combination of a half-tone phase shift film and a transparent phase shift film is disclosed focusing respective advantages of such a complete transmission phase shift mask and a half-tone phase shift mask.

In the photomask disclosed in the above Patent Application, only one layer (lower layer phase shift film) of phase shifter (peripheral portion) is located in the periphery of the opening portion (transparent portion), and the region opposite to the opening portion of the peripheral portion is a half-tone portion wherein an upper layer phase shift film is stacked on a lower layer phase shift film. In this photomask, the transmitted light from the opening portion has the phase opposite to the phase of the transmitted light from the peripheral portion, and although phase difference adjustment is performed so that the transmitted light from the peripheral portion has the phase opposite to the transmitted light from the half-tone portion, the film forming conditions must be strictly controlled to perform such phase difference adjustment at high accuracy, causing the complication of the fabrication process and the elevation of costs. Even if phase difference adjustment is performed by the etching of the substrate in the opening portion region, such problems still remain.

In another example in the above Patent Application, a configuration wherein a phase shifter is formed by digging down the substrate by etching, and a half-tone portion is formed in the region adjacent to the phase shifter is disclosed. In this configuration, the phase shifter (peripheral portion) is separated from the opening portion (transparent portion) to form a half-tone section between them. However, even if such a configuration is formed, a high degree of processing technique is required to form the phase shifter by etching so as to cause phase change of 180° in exposure light, and the problem of the complication of the fabrication process and the elevation of costs cannot be solved.

SUMMARY OF THE INVENTION

In view of these problems, the object of the present invention is to provide a configuration of a photomask blank that can enable the adjustment of phase difference and the control of transmittance in a translucent film (half-tone film), and a photomask fabricated using such a configuration of photomask blank.

In order to solve these problems, a half-tone stacked film of the present invention includes a phase advancement film that advances the phase of light transmitted through the film compared to the case wherein the light is propagated in the air, and a phase retardation film that retards the phase of light transmitted through the film compared to the case wherein the light is propagated in the air stacked on or under the phase advancement film.

In the half-tone stacked film, when the film thickness (nm) of the phase advancement film and phase retardation film is represented by $d^{(+)}$ and $d^{(-)}$, respectively; the refractive index of the films to the light transmitted through the films is $n^{(+)}$ and $n^{(-)}$, respectively; and the extinction coefficient thereof is $k^{(+)}$ and $k^{(-)}$, respectively; the phase advancement film satisfies the relationship of $k^{(+)} > a_1 \cdot n^{(+)} + b_1$, and the phase retardation film satisfies the relationship of $k^{(-)} < a_2 \cdot n^{(-)} + b_2$, wherein $a_1 = 0.113 \cdot d^{(+)} + 0.774$, $b_1 = -0.116 \cdot d^{(+)} - 0.281$, $a_2 = 0.113 \cdot d^{(-)} + 0.774$, and $b_2 = -0.116 \cdot d^{(-)} - 0.281$.

A photomask blank of the present invention is provided with a half-tone stacked film formed on a transparent substrate.

In the photomask blank, the absolute value of phase difference between light transmitted in the half-tone stacked film and light propagated in the air is 50 degrees or less, preferably 10 degrees or less, and more preferably 3 degrees or less.

In addition, in the photomask blank of the present invention, the transmittance of the half-tone stacked film to exposure light is 3% or more and 30% or less, and the film thickness of the half-tone stacked film is 50 nm or less.

The half-tone stacked film can be a film that is not substantially etched by oxygen-containing chlorine-based dry etching, but can be etched by fluorine-based dry etching.

When such a half-tone stacked film is selected, a photomask blank can be constituted as follows:

Specifically, the half-tone stacked film can be formed of a silicon-containing compound that contains, for example, an oxide, nitride or oxynitride of silicon, or an oxide, nitride or oxynitride of silicon and a transition metal as the major component thereof; and in this case, the transition metal is at least a metal element selected from a group consisting of titanium (Ti), vanadium (V), cobalt (Co), nickel (Ni), zirconium (Zr), niobium (Nb), molybdenum (Mo), hafnium (Hf), tantalum (Ta) and tungsten (W).

In the photomask blank, the phase advancement film and the phase retardation film are sequentially stacked on the transparent substrate, and the phase retardation film can be constituted so as to be a saturated nitride or saturated oxynitride of silicon, or a saturated nitride or saturated oxynitride of silicon and a transition metal.

In addition, a light-shield film can be formed on the half-tone stacked film. In this case, the light-shield film can be constituted to be a multilayer structure wherein a plurality of layers are sequentially stacked.

The light-shield film formed in the photomask blank is preferably a film containing chromium (Cr) as the major component thereof that is not substantially etched by fluorine-based dry etching, but can be etched by oxygen-containing chlorine-based dry etching.

The light-shield film is a film containing, for example, metallic chromium, chromium oxide, chromium nitride, chromium oxynitride, chromium oxycarbide, chromium nitrocarbide or chromium oxynitrocarbide as the major component thereof.

The half-tone stacked film formed in the photomask blank of the present invention can be a film that is not substantially etched by fluorine-based dry etching, but can be etched by oxygen-containing chlorine-based dry etching.

When such a half-tone stacked film is selected, the half-tone stacked film is preferably a film containing metallic chromium, chromium oxide, chromium nitride, chromium oxynitride, chromium oxycarbide, chromium nitrocarbide or chromium oxynitrocarbide as the major component thereof; and a light-shield film can be formed on the half-tone stacked film.

The light-shield film is preferably a film containing a metal, metal oxide, metal nitride, metal oxynitride, metal oxycarbide, metal nitrocarbide, or metal oxynitrocarbide as a major component containing a metal element selected from a group consisting of silicon, tantalum, molybdenum and tungsten as the major component thereof.

In the photomask blank of the present invention, the light-shield film may have an antireflective function. The sum of optical densities to exposure light of the half-tone stacked film and the light-shield film is preferably 2.5 or more.

The photomask of the present invention is fabricated using such a photomask blank.

A method for fabricating a photomask blank of the present invention is characterized in including steps for forming the above-described half-tone stacked film on a transparent substrate, and providing heat treatment at a temperature of 150° C. or above and 600° C. or below to the half-tone stacked film. The temperature for the heat treatment is preferably 200° C. or above and 600° C. or below, and more preferably 300° C. or above and 600° C. or below.

According to the present invention, since a "phase advancement film" and a "phase retardation film" are integrated by stacking or the like to constitute a half-tone film, and the phase advancement quantity in the phase advancement film and the phase retardation quantity in the phase retardation film are cancelled, a sufficient optical extinction capacity is obtained, the degree of freedom to design a translucent film (half-tone film) of an extremely small phase difference in the light propagated in the air can be elevated, and the adjustment of phase difference and the control of transmittance in the half-tone stacked film can be facilitated. As a result, a photomask fabricating process can be simplified.

BRIEF DESCRIPTION OF THE DRAWINGS

FIG. 1A and FIG. 1B are schematic sectional views for illustrating examples of photomask blank structures of the present invention;

FIG. 2 is a diagram for illustrating the film-thickness dependency of phase difference of light transmitted through a film of a refractive index n=2.3 and an extinction coefficient k=0.3 from light propagated in the air, and transmittance thereof, when the wavelength λ of light transmitted through the film is 193 nm;

FIG. 7 is a schematic sectional view for illustrating the configuration of sputtering equipment used in the film formation of a photomask blank of the present invention;

DETAILED DESCRIPTION OF THE INVENTION

Figure 3:
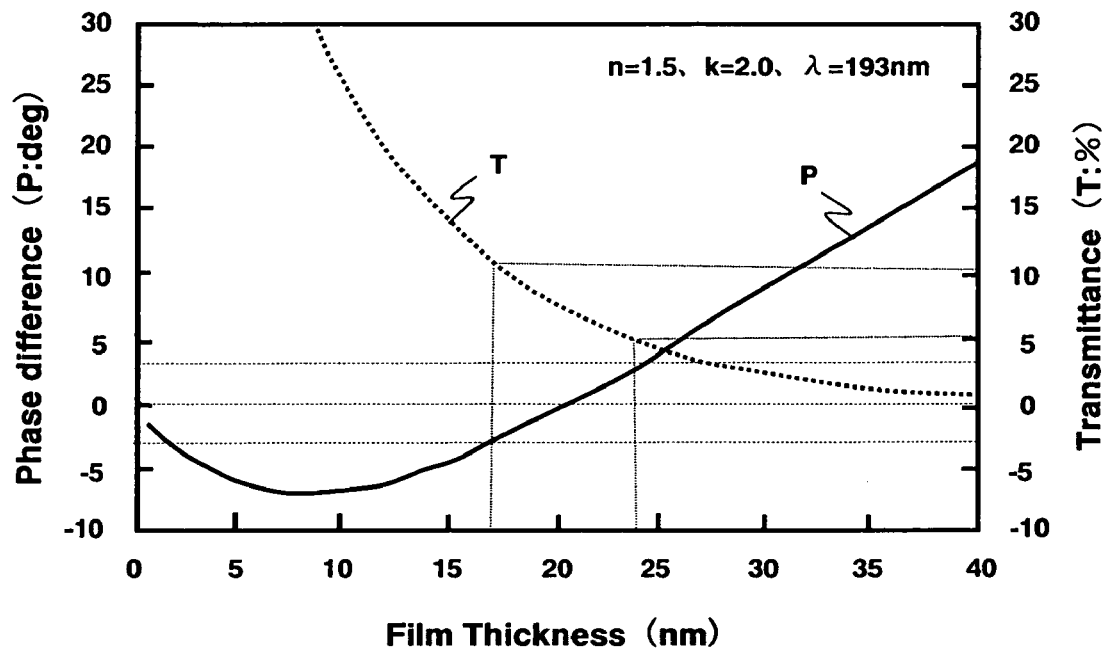
FIG. 3 is a diagram for illustrating the film-thickness dependency of phase difference of light transmitted through a film of a refractive index n=1.5 and an extinction coefficient k=2.0 from light propagated in the air, and transmittance thereof, when the wavelength λ of light transmitted through the film is 193 nm.

The best embodiment for carrying out the present invention will be described below referring to the drawings.

The present inventors found through repetitive examinations for the structure of a photomask blank for obtaining a photomask having advantages of both a complete transmission-type phase shift mask and a half-tone phase shift mask without requiring a complicated process or a highly accurate process, that if a film was designed so that the thickness d, refractive index n, and extinction coefficient k of an optical film had mutually predetermined relations, difference between the phase of light transmitted through such a film and the phase of light propagated in the air could be extremely reduced; and the phase difference could be made positive (the state wherein the phase of transmitted light through the film is advanced than light propagated in the air) or negative (the state wherein the phase of transmitted light through the film is retarded than light propagated in the air).

Although the detail will be described later, if such a "phase advancement film" and a "phase retardation film" are integrated by stacking or the like to cancel the phase advancement quantity of the phase advancement film and the phase retardation quantity of the phase retardation film, the stacked film can be used as a half-tone film (half-tone stacked film) having a sufficient light extinction capacity and extremely small phase difference from light propagated in the air; therefore, a photomask having advantages of both the above-described complete transmission-type phase shift mask and half-tone phase shift mask can be obtained. The cancellation of the phase advancement quantity and phase retardation quantity described above is not required to be complete cancellation (i.e., zero phase variation), but can be at least a partial cancellation, and the cancellation level can be determined depending on various conditions required for a half-tone stacked film, such as optical properties.

Since phase adjustment as a photomask for fabricating a photomask blank having such a half-tone stacked film is basically only to make the phase of the phase shifter be reversed from the phase of the opening portion (phase difference: 180°), the fabrication process can be simplified.

The reason why the structure wherein a phase advancement layer is stacked on a phase retardation film is used here is that if these layers are independently used, it is undeniable that the selection of the film thickness d, refractive index n and extinction coefficient k required for reducing the phase difference from light propagated in the air (i.e., material selection) is extremely limited, and the degree of design freedom for a half-tone film is extremely restricted.

FIG. 1A and FIG. 1B are schematic sectional views for illustrating examples of photomask blank structures of the present invention. As FIG. 1A shows, a half-tone stacked film 12 is formed on one major surface of an optically transparent substrate 11, and the half-tone stacked film 12 is constituted by sequentially stacking a first half-tone film 13 (half-tone film on the substrate side) and a second half-tone film 14 (half-tone film on the surface side) as the basic structure of the photomask blank. Here, as the substrate 11, a commonly used transparent substrate, such as quartz glass, $CaF_2$ and aluminosilicate glass, can be used. One of the first and second half-tone films 13 and 14 is the above-described phase advancement film, and the other is the phase retardation film. Both the first half-tone film 13 and the second half-tone film 14 are not necessarily required to be single films, but a plurality of layers can be stacked to be a multilayer film that can produce predetermined phase advancement quantity or phase retardation quantity as a whole.

It is needless to say that a light-shield film 15 can be formed on the half-tone stacked film 12, the light-shield film 15 can be a multilayer structure wherein a plurality of layers are stacked, or the light-shield film 15 can have a antireflective function. When a light-shield film 15 can be formed on the half-tone stacked film 12, it is preferable that the aggregated sum of optical density of these two layers of exposure light is 2.5 or more. It is especially preferable that the optical density of 193 nm light, which is the wavelength of ArF exposure light is 3.0 or more.

In view of securing high patterning accuracy when such a photomask blank is processed into a photomask, the thickness of the half-tone stacked film 12 is preferably as thin as possible. Although the suitable film thickness of the half-tone stacked film 12 depends on the mask process, in general, it is preferably 50 nm or less, more preferably 20 nm or less.

The absolute value of phase difference between light transmitted through such a half-tone stacked film 12 and light propagated in the air must be reduced to a degree wherein the extinction effect due to interference of lights transmitted from these media is not significant. If the phase difference is 50° or less, the extinction effect can be 10% or less; and if phase difference is 10° or less, the extinction effect can be 1% or less.

Furthermore, if the phase-change quantity of light transmitted through the half-tone stacked film 12 differs depending on the location of the film (phase fluctuation in the surface), it is added to phase difference in the region of the pattern that requires the interference of light (e.g., pattern formed by digging the substrate), and the performance of the photomask is lowered. For example, since it is considered that phase fluctuation in the surface of 1° induces non-interfered light of about 2% to impart an unignorable effect to pattern transfer accuracy, it is preferable to reduce the phase fluctuation in the surface of the half-tone stacked film 12 as much as possible in view of high-accuracy patterning.

When such a phase fluctuation in the surface is considered, the phase difference of a half-tone film is preferably established to 3° or less. Since this degree of phase difference can make the phase difference quantity at most about 0.3° even if there is phase fluctuation in the surface of about 10%, non-interfered light can be suppressed to 0.6% or less. However, in the case of a uniform half-tone stacked film 12 having fluctuation in the surface of 3% or less, a photomask having phase difference of 10° or less, and sufficient performance can be obtained. It is desirable that the transmittance of the uniform half-tone stacked film 12 to exposure light is about 3 to 30% as in a conventional half-tone phase shift film.

The half-tone stacked film 12 is constituted by sequentially stacking a first half-tone film 13 and a second half-tone film 14, and the film thickness d, refractive index n to exposure light, and extinction coefficient k of these half-tone film is designed (material selection or the like) so that one of them is a phase advancement film and the other is a phase retardation film. Specifically, when the film thickness (nm), the refractive index to the light (exposure light) transmitted in the film, and the extinction coefficient of the phase advancement film are represented by $d^{(+)}$, $n^{(+)}$ and $k^{(+)}$, respectively; and the film thickness (nm), the refractive index to the light (exposure light) transmitted in the film, and the extinction coefficient of the phase retardation film are $d^{(-)}$, $n^{(-)}$, and $k^{(-)}$, respectively; the phase advancement film has the relationship of $k^{(+)} > a_1 \cdot n^{(+)} + b_1$, and the phase retardation film has the relationship of $k^{(-)} < a_2 \cdot n^{(-)} + b_2$. The factors a and b each are a factor of the film thickness: $a_1 = 0.113 \cdot d^{(+)} + 0.774$, $b_1 = -0.116 \cdot d^{(+)} - 0.281$ for the phase advancement film, $a_2 = 0.113 \cdot d^{(-)} + 0.774$, and $b_2 = -0.116 \cdot d^{(-)} - 0.281$ for the phase retardation film.

Although the reason why such parameters are established will be described below, first, it will be qualitatively described, and then, it will be quantitatively described.

FIG. 2 and FIG. 3 are diagrams for illustrating film-thickness (abscissa: nm) dependency of phase difference from light propagated in the air (left ordinate: degrees), and transmittance (right ordinate: %) of light transmitted through a film having a refractive index n and an extinction coefficient k, when the wavelength λ of light transmitted through the film is 193 nm, which summarizes the results analyzed by optical calculation. FIG. 2 shows an example of a film of refractive index n=2.3 and extinction coefficient k=0.3; and FIG. 3 shows an example of a film of refractive index n=1.5 and extinction coefficient k=2.0.

Referring FIG. 2, a film having a relatively small extinction coefficient k shows a film dependency wherein the transmittance is elevated with the thinning of film thickness, while the phase difference is lowered with the thinning of film thickness; however, it shows that the phase difference is always positive (excluding the phase difference=0 when the film thickness is zero), and regardless of film thickness, the phase always advances. However, the film thickness dependency is only an example, but it is possible to make phase difference positive (phase advancement) or negative (phase retardation) depending on the selection of optical parameters (material selection).

Referring FIG. 3, when refractive index n=1.5 and extinction coefficient k=2.0, only a tendency wherein transmittance is elevated with the thinning of the film thickness is shown, while the phase difference has a minimum value, and the value is negative. Specifically, the phase difference that shows monotonic descending tendency with the thinning of the film thickness shows 0 (zero) at a film thickness of about 20 nm, it further decreases, and after showing a negative minimum value at a film thickness of 5 to 10 nm, it shows a tendency to increase again. This means that phase can be retarded or advanced by changing the film thickness.

The reason why refractive index n was made to be 1.5 and extinction coefficient k was made to be 2.0 here was that the case wherein an MoSiON unsaturated compound was selected as the material was assumed, and in this example, in order to set the phase difference within a range of 0±3° (shown by dot lines in FIG. 3) the film thickness could be set at 17 to 24 nm, and the transmittance in this case was 5 to 11%.

As FIG. 2 and FIG. 3 show, when a half-tone film is constituted with a single film using phase difference adjustment by film thickness (and material selection), the film must be designed so that the phase difference is set at a desired value (e.g., around 0°) by adjusting parameters n and k for setting the transmittance of the film to a desired value. However, in such a single film, since change in phase difference relative to the film thickness is large, hard and complicated operations are required in optical adjustment for setting the phase difference within a desired range. In addition, since optical properties changes to a large extent by slight variation in conditions, the control for stabilizing the fabrication process is not easy.

In the present invention, therefore, a phase retardation film and a phase advancement film are combined, the degree of design freedom of each film is elevated, and then the phase retardation quantity and phase advancement quantity are cancelled, to elevate the degree of design freedom for the entire half-tone film.

Figure 4:
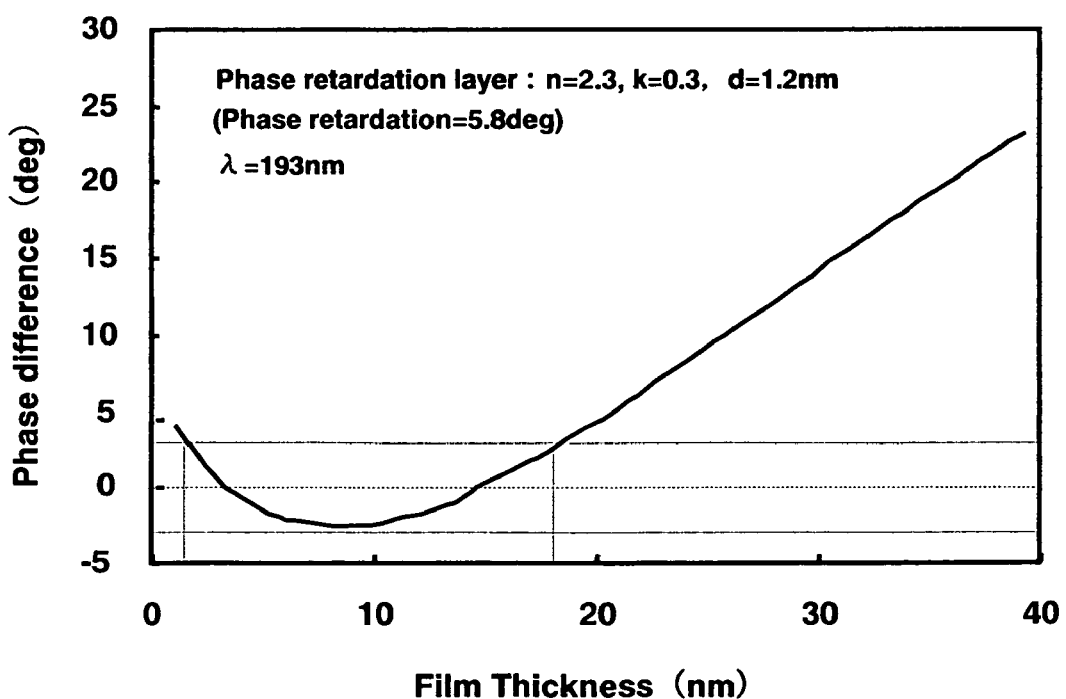
FIG. 4 is a diagram for illustrating the film-thickness dependency of phase difference when a film having a relatively low extinction coefficient k is a phase advancement layer, a film having a relatively high extinction coefficient k is a phase retardation layer, and these are stacked to form a half-tone stacked film.

FIG. 4 is a diagram for illustrating the film-thickness dependency of phase difference when a film having a relatively low extinction coefficient k is a phase advancement layer, a film having a relatively high extinction coefficient k is a phase retardation layer, and these are stacked to form a half-tone stacked film. Here, an example wherein the film thickness of a phase advancement film having a low extinction coefficient k is made to be 1.2 nm (constant), and the phase advancement film is stacked on a phase retardation film having a high extinction coefficient k (film thickness d: abscissa) is shown. Therefore, the total film thickness of the half-tone stacked film is a value obtained by adding 1.2 nm to the film thickness value in the abscissa. As the optical constants of the phase advancement film having a low extinction coefficient k, refractive index n=2.3, extinction coefficient k=0.3, and the phase advancement quantity to the light having a wavelength of 193 nm in a single film is 5.8°.

As obviously seen from the results shown in FIG. 4, the film thickness range of the phase retardation film wherein the phase difference of the entire half-tone stacked film is within a range of 0±3° is 2 to 18 nm (Δ=16 nm), which is twice or more compared with the case of the single film shown in FIG. 3 (17 to 24 nm: Δ=7 nm). If a half-tone film is constituted by thus stacking a phase advancement layer and a phase retardation film, a half-tone mask blank having an optional transmittance and small phase difference can be easily designed, the property variation due to the fluctuation of the fabricating conditions can be minimized, and stable production becomes possible.

In order to design such a half-tone stacked film, advancing and retarding conditions for the phase in a single film must be clearly determined. An example of obtaining the combination of refractive index n and extinction coefficient k for making phase difference 0° will be described below.

Figure 5:
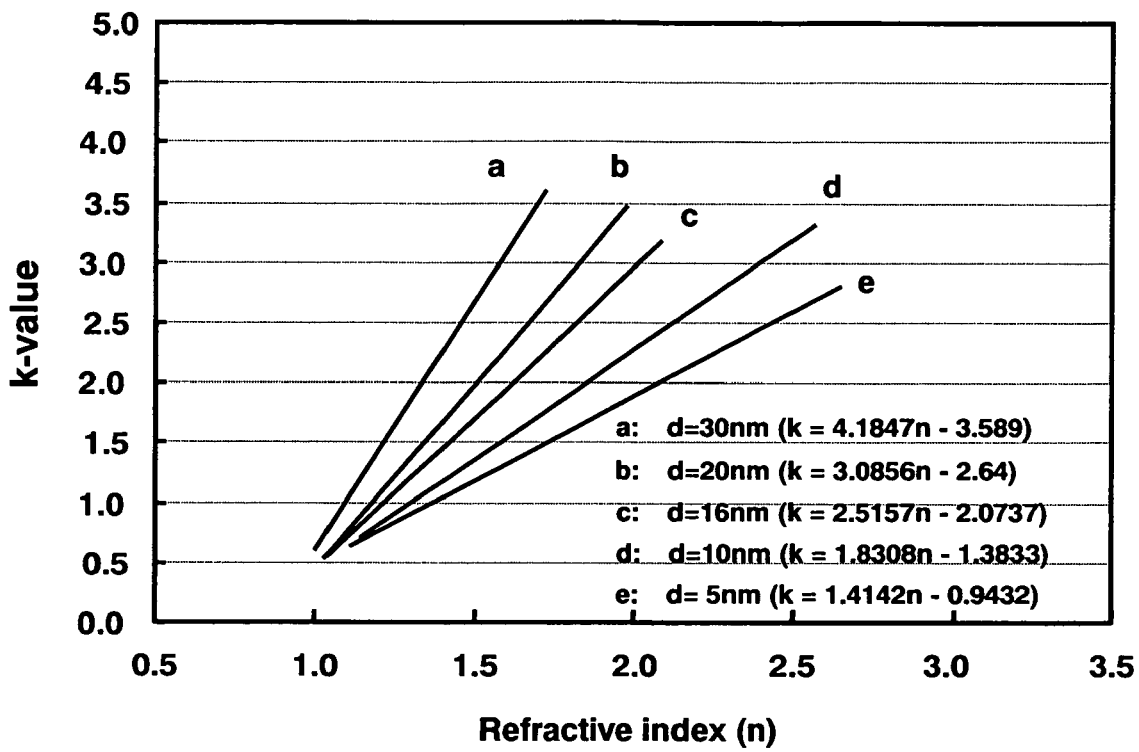
FIG. 5 is a graph of relationship between refractive indices n and extinction coefficients k for obtaining phase difference 0° when the film thickness of a single film is 5 nm, 10 nm, 16 nm, 20 nm and 30 nm.

FIG. 5 is a graph of relationship between refractive indices n and extinction coefficients k for obtaining phase difference 0° when the film thickness of a single film is 5 nm, 10 nm, 16 nm, 20 nm and 30 nm, and the straight line shown here is a "phase advancement-retardation boundary line" for each film thickness. Since the phase advancement-retardation boundary line can be substantially drawn as a straight line, it can be expressed as the relationship of $k = a \cdot n + b$, and gradient a and segment b in this case depend on film thickness d.

Figure 6:
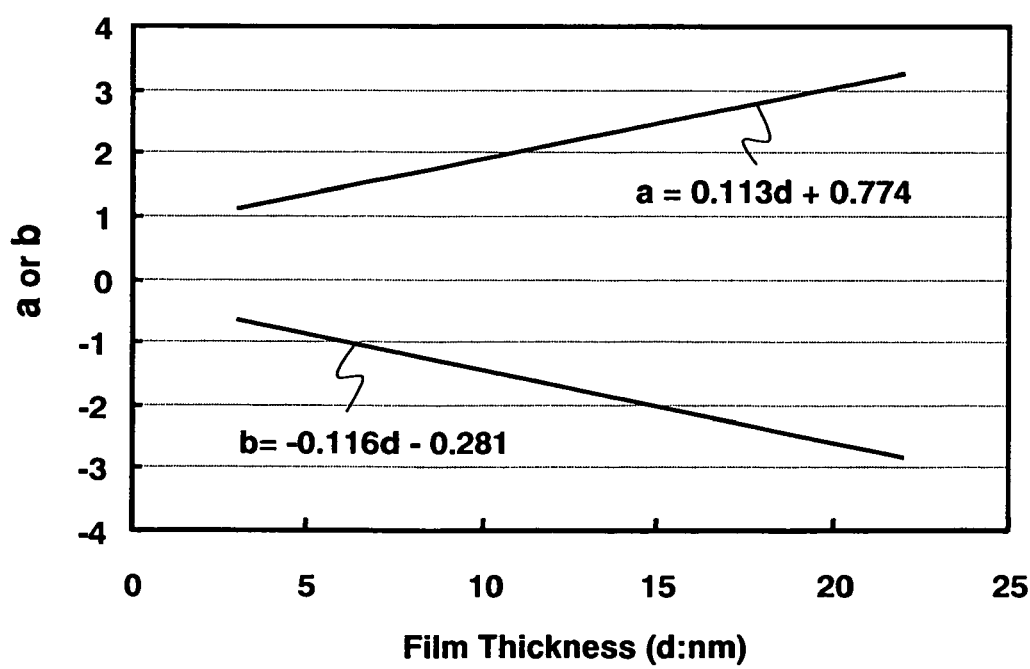
FIG. 6 is a graphic diagram of relationship between film thicknesses (nm) obtained in FIG. 5, and gradient and segment.

FIG. 6 is a graphic diagram of relationship between film thicknesses (nm) obtained in FIG. 5, and gradient and segment. From this graph, it can be known that the factors a and b of the phase advancement-retardation boundary line (k=a·n+b) are given by a=0.113·d+0.774 and b=−0.116·d−0.281. Specifically, in order to form a phase advancement layer, film thickness d, refractive index n and extinction coefficient k are determined to satisfy k>a·n+b; and in order to form a phase retardation layer, film thickness d, refractive index n and extinction coefficient k are determined to satisfy k<a·n+b.

Although each of a phase advancement film and a phase retardation film can be a structure wherein a plurality of layers are stacked, when these films are made to be a single-layer structure, it is preferable to select a material having a large extinction coefficient k and a small refractive index n. This is because if the extinction coefficient k is large, a desired transmittance can be obtained even if the film is thin, and if the refractive index n is small, the phase shift quantity per unit film thickness is small, resulting in a thin half-tone stacked film of a small phase shift quantity.

It is assumed that the photomask blank of the present invention is patterned after forming a light shield region, a translucent (half-tone) region and a transparent region. In this case, as FIG. 1B shows, a light shield film 15 is generally formed on the half-tone stacked film 12. In such a light shield film, a material having a large etching selectivity with the material for the half-tone stacked film is preferably used, and specifically, a film that is substantially not etched by fluorine-based dry etching, but can be etched by oxygen-containing chlorine-based dry etching, is preferable. Examples of such materials include chromium-based materials, such as metallic chromium (Cr), oxides of chromium (CrO), nitrides of chromium (CrN), oxynitrides of chromium (CrON), oxycarbides of chromium (CrOC), nitrocarbides of chromium (CrNC), and oxynitrocarbides of chromium (CrONC). It is needless to say that a plurality of these films can be combined and stacked to fabricate a light shield film.

In addition, a high etching selectivity can be obtained by forming such a half-tone stacked film which is to serve as an underlayer of such a light shield film using a material that is not etched by oxygen-containing chlorine-based dry etching, and can be etched by fluorine-based dry etching. Examples of materials for such a half-tone stacked film include oxides, nitrides or oxynitrides of silicon, or silicon-containing compounds containing oxides, nitrides or oxynitrides of silicon and a transition metal as a major component; and as the transition metal, at least one metal element selected from a group consisting of titanium (Ti), vanadium (V), cobalt (Co), nickel (Ni), zirconium (Zr), niobium (Nb), molybdenum (Mo), hafnium (Hf), tantalum (Ta) and tungsten (W); however, from the point of view of dry-etching workability, chemical resistance and electrical conductivity, molybdenum is most preferable.

Here, if the above-described silicon-containing compounds are unsaturated compounds (unsaturated oxide, unsaturated nitride, unsaturated oxynitride, and the like), these materials are material commonly used in processes of half-tone phase shift masks, there is a technical advantage wherein existing mask processes can be utilized.

Although either phase advancement film or phase retardation film can be disposed on the substrate side from the point of view of phase difference adjustment, when chemical resistance is considered, it is desirable to dispose the phase advancement film on the substrate side and the phase retardation film on the outer layer side. This is because in the phase retardation film, although a material having a larger refractive index and smaller extinction coefficient than the phase advancement film can be used as described above, such film can be composed of a saturated nitride or a saturated oxynitride, and often excels in chemical resistance than the metal film.

In particular, the saturated nitride or saturated oxynitride containing a metal and silicon represented by MoSiON often exerts high chemical resistance. Specifically, when chemical resistance is considered, a phase advancement film and a phase retardation film are stacked in this order on a transparent substrate, and as a material for the phase retardation film, a saturated nitride or a saturated oxynitride of silicon, or a saturated nitride or a saturated oxynitride of silicon and a transition metal, or the like is used. The extinction coefficient k of the phase retardation film of such configuration is preferably set at 1 or less.

For the purpose of improving chemical resistance, annealing at a temperature of 150° C. or above is effective. Although such an annealing step can be carried out in any stages of the process if the step is carried out after forming the half-tone stacked film, it is important to perform sufficient cleaning before the annealing step to eliminate problems of foreign matter adhering or the like. The annealing temperature in this case is preferably 200° C. or above, more preferably 300° C. or above. If the annealing temperature exceeds 600° C., the optical properties of the half-tone stacked film are largely changed and property control becomes difficult; therefore, the temperature is preferably 600° C. or below.

It is described above that when patterning is performed after forming a light shield region, a half-tone region and a transparent region, if a light shield film that is not substantially etched by fluorine-based dry etching but can be etched by oxygen-containing chlorine-based dry etching, and a half-tone stacked film that is not substantially etched by oxygen-containing chlorine-based dry etching but can be etched by fluorine-based dry etching are combined, sufficiently large etching selectivity can be obtained between these films; however, it is needless to say that a film that is not substantially etched by fluorine-based dry etching but can be etched by oxygen-containing chlorine-based dry etching can be selected as the half-tone stacked film. In this case, a film that is not substantially etched by oxygen-containing chlorine-based dry etching but can be etched by fluorine-based dry etching is selected as the light shield film.

Examples of materials for such a half-tone stacked film include metallic chromium, oxides of chromium, nitrides of chromium, oxynitrides of chromium, oxycarbides of chromium, nitrocarbides of chromium, and oxynitrocarbides of chromium; and examples of materials for a light shield film include materials containing metals, metal oxides, metal nitrides, metal oxynitrides, metal oxycarbides, metal nitrocarbides, or metal oxynitrocarbides as a major component containing a metal element selected from a group consisting of silicon, tantalum, molybdenum and tungsten as the major component.

The combination of a film that is not substantially etched by fluorine-based dry etching but can be etched by oxygen-containing chlorine-based dry etching as a half-tone stacked film, and a film that is not substantially etched by oxygen-containing chlorine-based dry etching but can be etched by fluorine-based dry etching as a light shield film is particularly effective when these films are formed on an $SiO_2$-based substrate. The reason for this is that since the $SiO_2$-based substrate is not substantially etched by oxygen-containing chlorine-based dry etching but can be etched by fluorine-based dry etching, high etching characteristics can be obtained in every step in a series of etching steps proceeding in the order of the light shield film, half-tone stacked film and substrate.

The present invention will be described below in further detail referring to examples.

EXAMPLE 1

Photomask Blank

In this example, a photomask blank wherein a half-tone stacked film of the present invention is formed on a substrate, and a photomask blank wherein the half-tone stacked film and a light shield film are sequentially stacked will be described.

[Half-Tone Stacked Film]

FIG. 7 is a schematic sectional view for illustrating the configuration of sputtering equipment used in the film formation of a photomask blank of the present invention. In FIG. 7, reference 11 denotes a transparent substrate, which is a quartz substrate of 6-inch square, 101 denotes a chamber; 102a denotes a first target; 102b denotes a second target; 103 denotes a sputtering gas inlet; 104 denotes a gas outlet; 105 denotes a substrate turn table; and 106a and 106b denote power sources for impressing bias voltages to first and second targets, respectively.

Using the sputtering equipment, a phase advancement film composed of an unsaturated oxynitride film (first MoSiON film) consisting of molybdenum and silicon, and a phase retardation film composed of an oxynitride film (second MoSiON film) consisting of molybdenum and silicon were sequentially formed on a quartz substrate to be a half-tone stacked film.

First, in forming the phase advancement film (first MoSiON film), 20 sccm of Ar gas, and a mixed gas of 5 sccm of $N_2$ and 2 sccm of $O_2$ were introduced as a sputtering gas. When such a sputtering gas is introduced, the gas flow rate was controlled so that the gas pressure in the chamber 101 became 0.10 Pa. Thereafter, discharge power of 800 W and 200 W were impressed to an $MoSi_2$ (sintered composite) target and an Si (single crystal) target, respectively, and the substrate was turned at 30 rpm to form an unsaturated oxynitride film consisting of molybdenum and silicon of a thickness of 15.0 nm.

Next, in forming the phase retardation film (second MoSiON film), 5 sccm of Ar gas, and a mixed gas of 50 sccm of $N_2$ and 0.2 sccm of $O_2$ were introduced as a sputtering gas. When such a sputtering gas is introduced, the gas flow rate was controlled so that the gas pressure in the chamber 101 became 0.07 Pa. Thereafter, discharge power of 100 W and 900 W were impressed to an $MoSi_2$ (sintered composite) target and an Si (single crystal) target, respectively, and the substrate was turned at 30 rpm to form an oxynitride film consisting of molybdenum and silicon of a thickness of 1.5 nm.

Thus formed stacked film was heat-treated at 200° C. for 2 hours to form a half-tone stacked film of a half-tone mask blank. The thickness of the half-tone stacked film was adjusted so that the transmittance thereof became about 9%.

In order to check the optical properties of each of the above-described first MoSiON film (phase advancement film) and second MoSiON film (phase retardation film), these films were independently formed under respective conditions as described above, and the optical constants of each film under light of a wavelength of 193 nm (ArF excimer laser) were determined. The phase advancement film had a refractive index n of 1.791 and an extinction coefficient k of 2.465, and the phase retardation film had a refractive index n of 2.489 and an extinction coefficient k of 0.443.

When the values of the film thickness (d=15 nm) and refractive index (n=1.791) of the first MoSiON film are substituted in the equation indicating the phase advancement-retardation boundary line, the extinction coefficient k that satisfies the boundary condition is 2.40. Since the extinction coefficient k of the first MoSiON film is 2.465, which is larger than the value of the boundary condition (k=2.40), it is known that the phase is advanced, and functions as a phase advancement film.

Similarly, when the values of the film thickness (d=1.5 nm) and refractive index (n=2.489) of the second MoSiON film are substituted in the equation indicating the phase advancement-retardation boundary line, the extinction coefficient k that satisfies the boundary condition is 1.89. Since the extinction coefficient k of the second MoSiON film is 0.443, which is smaller than the value of the boundary condition (k=2.40), it is known that the phase is retarded, and functions as a phase retardation film.

The results of evaluating various properties of the half-tone stacked film wherein a phase advancement film and a phase retardation film of such optical properties are stacked are as follows:

First, as optical properties, the transmittance and phase difference of the half-tone stacked film when light was radiated from the transparent substrate side was measured using a phase difference meter. As a result, the transmittance at a wavelength of 193 nm was 8.70%, and phase difference was 2.81°.

Chemical resistance was evaluated by measuring change in transmittance when the samples were immersed in a solution (40° C.) consisting of ammonia water (30% by weight), hydrogen peroxide solution (30% by weight) and pure water in a ratio of 1:1:30 for 1 hour. The wavelength for measuring the transmittance was 193 nm. It was considered that the sample that excelled in chemical resistance had showed small change in transmittance between before and after immersion in the solution, and change in transmittance of the half-tone stacked film of the present invention before and after immersion in the solution was only 0.167% exhibiting extremely high chemical resistance.

As known from these results, it was confirmed that the half-tone stacked film formed by sequentially forming an oxynitride film composed of molybdenum and silicon (MoSiON film: phase retardation film) on an unsaturated oxynitride film composed of molybdenum and silicon (MoSiON film: phase advancement film) had small phase shift quantity and excelled in chemical resistance.

[Light-Shield Film]

The photomask blank of the present invention can be of a configuration wherein a chromium-based light shield film is formed on the above-described half-tone stacked film. The formation of such a light shield film can also be performed using sputtering equipment of the configuration as shown in FIG. 7 in the same manner as in the half-tone stacked film. The chromium-based light shield film (light shield film and/or antireflective film) can be formed using a target composed of chromium metal alone, or chromium to which one selected from oxygen, nitrogen and carbon, or the combination thereof is added.

Specifically, when a Cr—O—N—C-based film is formed, one or more of a carbon-containing gas such as $CH_4$, $CO_2$ and CO, a nitrogen-containing gas such as NO, $NO_2$ and $N_2$ and an oxygen-containing gas such as $CO_2$, NO and $O_2$ is introduced as the sputtering gas. A gas formed by adding an inert gas, such as Ar, Ne and Kr to these gases can also be used. In particular, from the point of view of uniformity in the substrate and controllability during fabrication, it is preferable to use $CO_2$ gas or CO gas as a carbon source and oxygen source. In addition, as a method for introducing gas, various sputtering gases can be separately introduced into the chamber, or certain gases or all the gases can be collectively introduced into the chamber.

The preferable composition in the case of a chromium oxynitride film (CrON film) is 20 to 95 atomic percent Cr, 1 to 50 atomic percent N, and 1 to 60 atomic percent O; more preferably 30 to 85 atomic percent Cr, 5 to 40 atomic percent N, and 5 to 50 atomic percent O. The preferable composition in the case of a CrONC film is 20 to 95 atomic percent Cr, 1 to 20 atomic percent C, 1 to 60 atomic percent O, and 1 to 30 atomic percent N; more preferably 30 to 80 atomic percent Cr, 2 to 15 atomic percent C, 5 to 50 atomic percent O, and 3 to 20 atomic percent N.

The light shield film in this example was obtained by forming an antireflective film of a CrON film on a CrN light shield film having the above-described composition using commonly used single-target magnetron DC sputtering equipment.

First, in the formation of a CrN light shield film, 20 sccm of Ar gas and 5 sccm of $N_2$ gas were introduced as the sputtering gas. In this case, no $O_2$ gas was introduced. When such a sputtering gas was introduced, the gas flow rate was controlled so that the gas pressure in the chamber 101 became 0.10 Pa. Then, a discharge power of 1000 W was impressed to the Cr target, and the substrate was turned at 30 rpm to form a CrN film of a thickness of 27 nm.

Next, in the formation of a CrON antireflective film, a mixed gas consisting of 10 sccm of Ar gas, 30 sccm of $N_2$ gas, and 15 sccm of $O_2$ gas was introduced as the sputtering gas. When such a sputtering gas was introduced, the gas flow rate was controlled so that the gas pressure in the chamber 101 became 0.1 Pa. Then, a discharge power of 1000 W was impressed to the Cr target, and the substrate was turned at 30 rpm to form a CrON film of a thickness of 20 nm.

The optical density of thus obtained chromium-based light shield film at 193 nm was 2.3. The value of this optical density means that if it is formed on the above-described half-tone stacked film (a transmittance of 8.70% equivalent to an optical density of 1.1), a total optical density of 3.4 is obtained. In general, the light shield capacity of a binary film is said to be sufficient if the optical density thereof is 3 or more, and if it is 2.5 or more in the light shield region of a half-tone mask. In view of this, it is known that the chromium-based light shield film obtained in this example has a practically sufficient light shield capacity.

The sheet resistance of the chromium-based light shield film of this example was 40 Ω/▽. Since the degree of a charge-up preventing effect required in the fabrication process depends on the drawing conditions in the patterning step, it is generally said to be desirable that the sheet resistance is 1000 Ω/▽ or less. Specifically, it is obvious that the chromium-based light shield film of this example is expected to have a practically sufficient charge-up preventing effect.

The reflectivity for light having a wavelength of 257 nm was 17%. In order to carry out high-accuracy defect inspection using a defect inspection system commonly used in a mask fabricating step, the reflectivity for light having a wavelength of 257 nm must be within a range between 10% and 20%. Therefore, it is known that the chromium-based light shield film of this example has an optical property (reflectivity) suited for the test during a mask fabricating step.

COMPARATIVE EXAMPLE

This comparative example was carried out for describing the results of comparison for various properties of a half-tome film having a heretofore known simple configuration with various properties of a half-tone stacked film of the present invention.

The half-tone film of this comparative example was an unsaturated oxynitride film containing molybdenum and silicon formed on a quartz substrate using sputtering equipment shown in FIG. 7. In the formation of a half-tone film, a mixed gas consisting of 20 sccm of Ar gas, 9 sccm of $N_2$ gas, and 0.2 sccm of $O_2$ gas was introduced as the sputtering gas. When such a sputtering gas was introduced, the gas flow rate was controlled so that the gas pressure in the chamber 101 became 0.1 Pa. Then, discharge powers of 100 W and 900 W were impressed to the $MoSi_2$ (sintered composite) target and the Si (single crystal) target, respectively, and the substrate was turned at 30 rpm to form an unsaturated oxynitride film (MoSiCrON film) consisting of molybdenum and silicon of a thickness of 18.0 nm. Then, the formed film was heat-treated at 200° C. for 2 hours to form a half-tone film of the half-tone mask blank. The thickness of the half-tone film was adjusted so that transmittance became about 9%.

The optical constants of the half-tone film measured using light of a wavelength of 193 nm (ArF excimer laser) were a refractive index n of 1.791 and an extinction coefficient k of 2.010. When the values of film thickness (d=18.0 nm) and refractive index (n=2.010) are substituted in the above-described equation for representing the phase advancement-retardation boundary line described above, the extinction coefficient k that satisfies boundary conditions is 3.275. Since the extinction coefficient k of the above-described half-tone film is 2.010, and is smaller than the value of the boundary condition (k=3.275), it means phase retardation.

The results of various properties of the half-tone film having such optical properties are as follows:

First, as optical properties, the transmittance and phase difference of the half-tone film when light was radiated from the transparent substrate side were measured using a phase difference meter. As a result, the transmittance at a wavelength of 193 nm was 8.70% and the phase difference was 7.380.

Chemical resistance was evaluated by measuring change in transmittance when the samples were immersed in a solution (40° C.) consisting of ammonia water (30% by weight), hydrogen peroxide solution (30% by weight) and pure water in a ratio of 1:1:30 for 1 hour. The wavelength for measuring the transmittance was 193 nm. It was considered that the sample that excelled in chemical resistance had showed small change in transmittance between before and after immersion in the solution, and change in transmittance of the half-tone film of this comparative example before and after immersion in the solution was 2.283%.

When these result are compared with various properties of the half-tone stacked film of the present invention described in Example 1, although the transmittance of both films is 8.70%, the phase difference of the half-tone stacked film of the present invention is 2.81°, while the phase difference of the half-tone film of Comparative Example is 7.38°; and change in transmittance after immersion in the solution, which is an evaluation indicator of chemical resistance, of the half-tone stacked film of the present invention is 0.167%, while change in transmittance of the half-tone film of Comparative Example is 2.283%.

As described above, it was confirmed that the half-tone stacked film of the present invention could reduce the phase shift quantity compared with a conventional half-tone film of a common configuration, and exhibited high chemical resistance.

EXAMPLE 2

Process for Fabricating Phase Shift Mask

In this example, a process for fabricating a phase shift mask using a photomask blank of the present invention will be described.

Figure 8A:
FIG. 8A to FIG. 8G are diagrams for illustrating a fabricating process of a phase shift mask of the present invention.
Figure 8B:

FIG. 8A to FIG. 8G are diagrams for illustrating a fabricating process of a phase shift mask of the present invention. First, a photoresist film is applied onto a half-tone stacked film 12 formed on a substrate 11 (FIG. 8A), and a first resist pattern 16 is formed in the photoresist film (FIG. 8B).

Figure 8C:
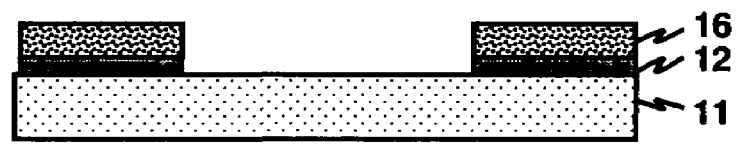
Figure 8D:
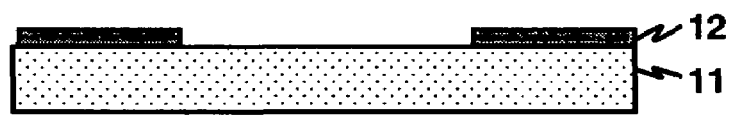

A half-tone stacked film 12 is patterned by fluorine-based dry etching using the first resist pattern thus obtained as a mask (FIG. 8C).

Figure 8E:
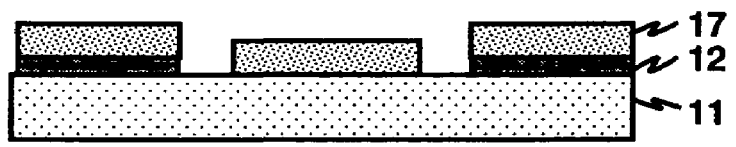

The first resist pattern 16 is peeled off in this state (FIG. 8D), and a new photoresist film is applied and patterned to form a second resist pattern 17 (FIG. 8E).

Figure 8F:
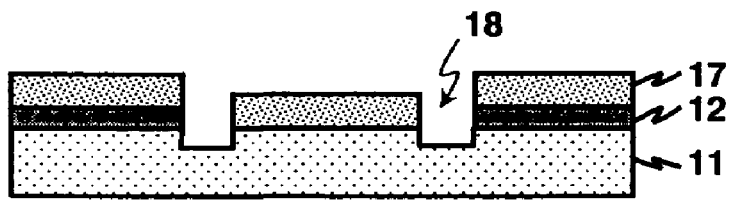
Figure 8G:

Next, a part of the substrate 11 is dry-etched using the patterned second resist pattern 17 as an etching mask to form trenches 18 (FIG. 8F). Then, the second resist pattern 17 is removed to complete a half-tone phase shift mask (FIG. 8G).

Figure 9:
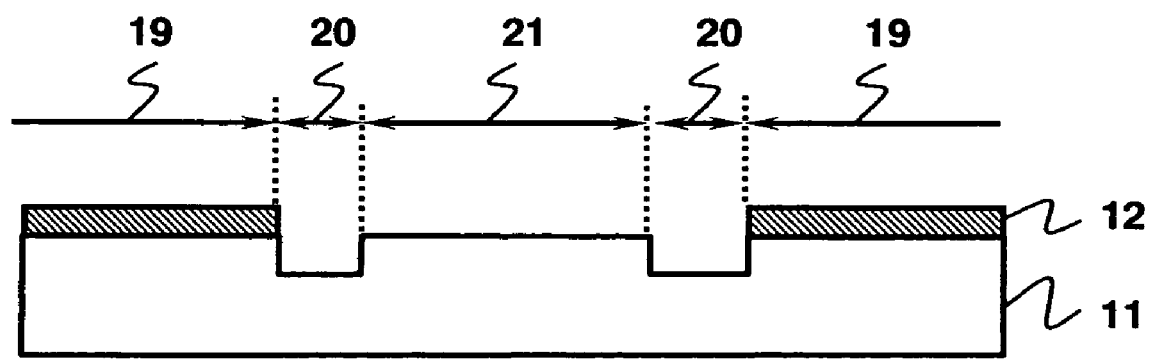
FIG. 9 is a conceptual sectional view of a half-tone phase shift mask of the present invention.

FIG. 9 is a conceptual sectional view of a half-tone phase shift mask of the present invention thus obtained, which is a half-tone phase shift mask formed by patterning half light shield portions 19 formed on the half-tone stacked film 12, a phase shifter (phase shift portion) 20 formed by removing a part of the substrate 11, and opening portion 21 formed by exposing the surface of the substrate 11. In the half-tone phase shift mask, light transmitted through the opening portion 21 has the same phase with light transmitted through the half light shield portions 19 (phase difference=0°), and light transmitted through the opening portion 21 and light transmitted through the phase shifter 20 have opposite phase to each other (phase difference=180°).

Although the photomask blank of the present invention, and the photomask fabricated using the photomask was described above referring to examples, the above-described examples are only examples for carrying out the present invention, and the present invention is in no way limited by these examples. Various modifications of these examples are within the scope of the present invention, and it is self-apparent from the above description that other various examples are also feasible within the scope of the present invention.

The present invention provides a photomask blank that can facilitate the phase difference adjustment and transmittance control in a translucent film (half-tone film); and a photomask fabricated using such a photomask blank.

What is claimed is:

1. A photomask blank comprising a half-tone stacked film on a transparent substrate, wherein the half-tone stacked film includes:
   a phase advancement film, which advances the phase of light transmitted through the film compared to the case wherein the light is propagated in the air, and
   a phase retardation film, which retards the phase of light transmitted through the film compared to the case wherein the light is propagated in the air, stacked on or under the phase advancement film,
   wherein, the phase advancement film satisfies the relationship of $k^{(+)} > a_1 \cdot n^{(+)} + b_1$, and the phase retardation film satisfies the relationship of $k^{(-)} < a_2 \cdot n^{(-)} + b_2$, wherein, $d^{(+)}$ and $d^{(-)}$ are the film thickness in nanometers of the phase advancement film and phase retardation film respectively, $n^{(+)}$ and $n^{(-)}$ are the refractive index of the phase advancement film and phase retardation film respectively, $k^{(+)}$ and $k^{(-)}$ are the extinction coefficient of the phase advancement film and phase retardation film respectively, and $a_1 = 0.113 \cdot d^{(+)} + 0.774$, $b_1 = -0.116 \cdot d^{(+)} - 0.281$, $a_2 = 0.113 \cdot d^{(-)} + 0.774$, and $b_2 = -0.116 \cdot d^{(-)} - 0.281$; and
   wherein the absolute value of a phase difference between light transmitted in the half-tone stacked film and light propagated in the air is 50 degrees or less.

2. The photomask blank according to claim 1, wherein the absolute value of the phase difference is 3 degrees or less.

3. The photomask blank according to claim 1, wherein the transmittance of the half-tone stacked film to exposure light is 3% or more and 30% or less.

4. The photomask blank according to claim 1, wherein the film thickness of the half-tone stacked film is 50 nm or less.

5. The photomask blank according to claim 4, wherein the film thickness of the half-tone stacked film is 20 nm or less.

6. The photomask blank according to claim 1, wherein the half-tone stacked film is resistive to oxygen-containing chlorine-based dry etching, and etchable by fluorine-based dry etching.

7. The photomask blank according to claim 6, wherein the half-tone stacked film includes a silicon-containing compound containing silicon oxide, silicon nitride or silicon oxynitride, or silicon oxide, silicon nitride or silicon oxynitride and a transition metal.

8. The photomask blank according to claim 7, wherein the transition metal includes at least a metal element selected from a group consisting of titanium (Ti), vanadium (V), cobalt (Co), nickel (Ni), zirconium (Zr), niobium (Nb), molybdenum (Mo), hafnium (Hf), tantalum (Ta) and tungsten (W).

9. The photomask blank according to claim 7, wherein the phase advancement film and the phase retardation film are sequentially stacked on the transparent substrate, and the phase retardation film includes saturated silicon nitride or saturated silicon oxynitride, or saturated silicon nitride or saturated silicon oxynitride and a transition metal.

10. The photomask blank according to claim 1 further comprising a light-shielding film on the half-tone stacked film.

11. The photomask blank according to claim 10, wherein the light-shielding film includes chromium (Cr) that is resistive to fluorine-based dry etching and etchable by oxygen-containing chlorine-based dry etching.

12. The photomask blank according to claim 11, wherein the light-shielding film includes at least one material selected from the group consisting of metallic chromium, chromium oxide, chromium nitride, chromium oxynitride, chromium oxycarbide, chromium nitrocarbide and chromium oxynitrocarbide.

13. The photomask blank according to claim 1, wherein the half-tone stacked film is resistive to fluorine-based dry etching and etchable by oxygen-containing chlorine-based dry etching.

14. The photomask blank according to claim 13, wherein the half-tone stacked film includes at least one material selected from the group consisting of metallic chromium, chromium oxide, chromium nitride, chromium oxynitride, chromium oxycarbide, chromium nitrocarbide and chromium oxynitrocarbide.

15. The photomask blank according to claim 10, wherein the sum of optical densities to exposure light of the half-tone stacked film and the light-shielding film is 2.5 or more.

16. The photomask blank according to claim 13 further comprising a light-shielding film on the half-tone stacked film.

17. The photomask blank according to claim 16, wherein the light-shielding film includes at least one material selected from the group consisting of a metal, metal oxide, metal-nitride, metal oxynitride, metal oxycarbide, metal nitrocarbide, and metal oxynitrocarbide, wherein the metal is selected from a group consisting of silicon, tantalum, molybdenum and tungsten.

18. The photomask blank according to claim 15, wherein the light-shielding film has an antireflective function.

19. The photomask blank according to claim 16, wherein the sum of optical densities to exposure light of the half-tone stacked film and the light-shielding is 2.5 or more.

20. A photomask fabricated using a photomask blank according to claim 1.

21. A method for fabricating a photomask blank comprising steps for forming the half-tone stacked film according to claim 1 on a transparent substrate, and providing heat treatment at a temperature of 150° C. or above and 600° C. or below to the half-tone stacked film.

22. The method for fabricating the photomask blank according to claim 21, wherein the temperature of the heat treatment is 200° C. or above and 600° C. or below.

23. The method for fabricating the photomask blank according to claim 22, wherein the temperature of the heat treatment is 300° C. or above and 600° C. or below.

24. The half-tone stacked film according to claim 1, wherein the absolute value of the phase difference is 10 degrees or less.

25. The half-tone stacked film according to claim 1, wherein the absolute value of the phase difference is 3 degrees or less.

26. A half-tone stacked film comprising:

a phase advancement film stacked on or under a phase retardation film, wherein an absolute value of a phase difference between light transmitted in the half-tone stacked film and light propagated through air is 50 degrees or less, and wherein the phase advancement film satisfies the relationship of $k^{(+)} > a_1 \cdot n^{(+)} + b_1$ and the phase retardation film satisfies the relationship of $k^{(-)} < a_2 \cdot n^{(-)} + b_2$, wherein $d^{(+)}$, $n^{(+)}$, and $k^{(+)}$ are the film thickness in nanometers, refractive index, and the extinction coefficient respectively of the phase advancement film, $d^{(-)}$, $n^{(-)}$, and $k^{(-)}$ are the film thickness in nanometers, refractive index, and the extinction coefficient respectively of the phase retardation film, and $a_1 = 0.113 \cdot d^{(+)} + 0.774$, $b_1 = -0.116 \cdot d^{(+)} - 0.281$, $a_2 = 0.113 \cdot d^{(-)} + 0.774$, and $b_2 = -0.116 \cdot d^{(-)} - 0.281$.

* * * * *